(12) United States Patent
Baldo et al.

(10) Patent No.: US 10,352,536 B2
(45) Date of Patent: Jul. 16, 2019

(54) SUPPORT STRUCTURE FOR LIGHTING DEVICES, CORRESPONDING LIGHTING DEVICE AND METHOD

(71) Applicant: Osram GmbH, Munich (DE)

(72) Inventors: Lorenzo Baldo, Giavera del Montello (IT); Federico Poggi, Venice (IT); Luigi Pezzato, Treviso (IT); Aleksandar Nastov, Munich (DE)

(73) Assignee: OSRAM GMBH, Munich (DE)

( * ) Notice: Subject to any disclaimer, the term of this patent is extended or adjusted under 35 U.S.C. 154(b) by 2 days.

(21) Appl. No.: 15/629,797

(22) Filed: Jun. 22, 2017

(65) Prior Publication Data

US 2017/0370560 A1    Dec. 28, 2017

(30) Foreign Application Priority Data

Jun. 22, 2016    (IT) .............................. 1020160064860

(51) Int. Cl.
*F21S 4/24*    (2016.01)
*H05K 1/09*    (2006.01)
(Continued)

(52) U.S. Cl.
CPC .......... *F21V 19/0015* (2013.01); *H01L 33/62* (2013.01); *H05K 1/092* (2013.01);
(Continued)

(58) Field of Classification Search
CPC .... F21V 19/0015; H05K 1/189; H05K 1/092; H05K 1/115; H05K 1/181; H05K 3/4038;
(Continued)

(56) References Cited

U.S. PATENT DOCUMENTS 5,418,690 A * 5/1995 Conn ................... H05K 1/0265
                                                      174/250
2006/0180346 A1* 8/2006 Knight ................... H05K 1/112
                                                      174/265

(Continued)

FOREIGN PATENT DOCUMENTS

EP    2806211 A1    11/2014
EP    2827687 A1    1/2015
(Continued)

OTHER PUBLICATIONS

Italian Search Report based on application No. 102016000064860 (7 pages) dated May 3, 2017.

*Primary Examiner* — Joseph L Williams
*Assistant Examiner* — Jose M Diaz
(74) *Attorney, Agent, or Firm* — Viering Jentschura & Partner MBB

(57) ABSTRACT

According to the present disclosure, a support structure for lighting devices, e.g. LED lighting devices, is provided with an electrically insulating core layer having a first and a second mutually opposed surfaces, with mounting locations for electrically-powered light radiation sources on the first surface, a network of electrically conductive lines printed on said first surface, at least some of said electrically conductive lines extending between the mounting locations and fixed locations on the first surface, and electrical distribution lines of electrically conductive material on the second surface of the core layer, and electrically conductive vias extending through core layer and electrically coupling the electrical distribution lines on the second surface with the electrically conductive lines at said fixed locations on the first surface.

14 Claims, 2 Drawing Sheets

(51) Int. Cl.
*H05K 1/11* (2006.01)
*H05K 1/18* (2006.01)
*H05K 3/12* (2006.01)
*H05K 3/40* (2006.01)
*F21V 19/00* (2006.01)
*H01L 33/62* (2010.01)
*F21Y 103/10* (2016.01)
*F21Y 115/10* (2016.01)

(52) U.S. Cl.
CPC ............ *H05K 1/115* (2013.01); *H05K 1/181* (2013.01); *H05K 1/189* (2013.01); *H05K 3/12* (2013.01); *H05K 3/4038* (2013.01); *F21S 4/24* (2016.01); *F21Y 2103/10* (2016.08); *F21Y 2115/10* (2016.08); *H05K 3/125* (2013.01); *H05K 3/1216* (2013.01); *H05K 3/1275* (2013.01); *H05K 2201/0108* (2013.01); *H05K 2201/0145* (2013.01); *H05K 2201/10106* (2013.01); *H05K 2201/2054* (2013.01); *H05K 2203/107* (2013.01)

(58) Field of Classification Search
CPC ........ H05K 3/12; H05K 3/1216; H05K 3/125; H05K 3/1275; H05K 2201/2054; H05K 2201/0145; H05K 2201/0108; H05K 2201/10106; H05K 2203/107; H01L 33/62; F21Y 2115/10; F21Y 2103/10; F21S 4/24; F21K 9/20; F21K 9/23; F21K 9/27

See application file for complete search history.

(56) References Cited

U.S. PATENT DOCUMENTS

| | | |
|---|---|---|
| 2015/0069452 A1 | 3/2015 | Zanotto et al. |
| 2015/0333239 A1 | 11/2015 | Tischler |
| 2018/0070436 A1* | 3/2018 | Feichtinger ........... H01L 25/167 |
| 2018/0070438 A1* | 3/2018 | Yamauchi ............ H05K 1/0224 |
| 2018/0070439 A1* | 3/2018 | Charbonneau ....... H05K 1/0219 |
| 2019/0014667 A1* | 1/2019 | Bahl ...................... H05K 3/429 |

FOREIGN PATENT DOCUMENTS

| | | |
|---|---|---|
| WO | 2012030536 A2 | 3/2012 |
| WO | 2012091364 A2 | 7/2012 |
| WO | 2012125331 A1 | 9/2012 |

\* cited by examiner

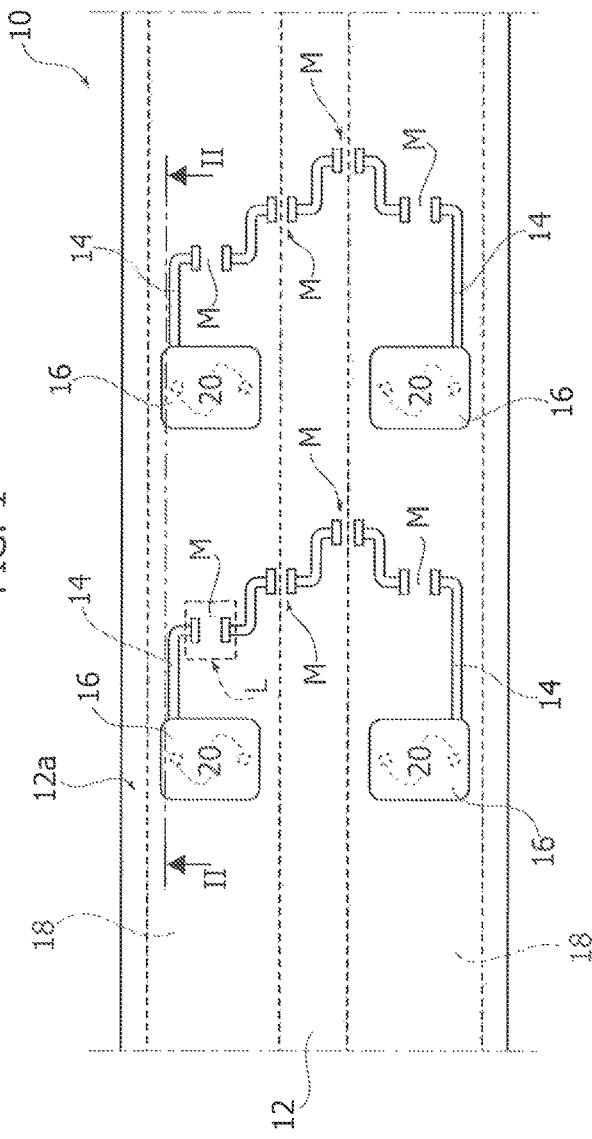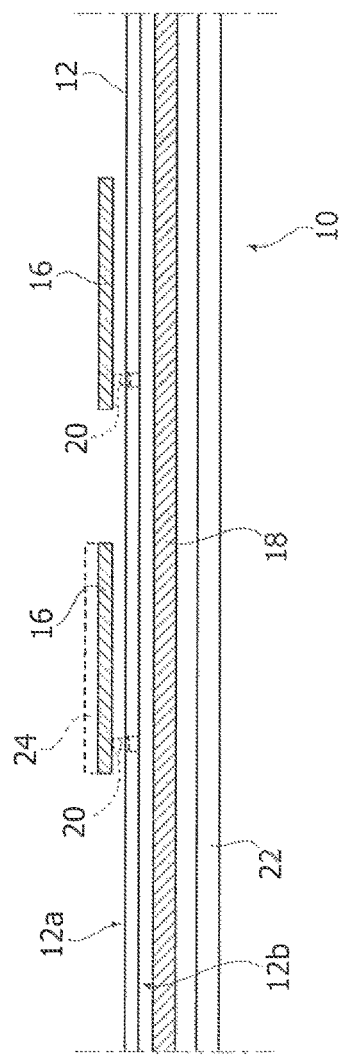

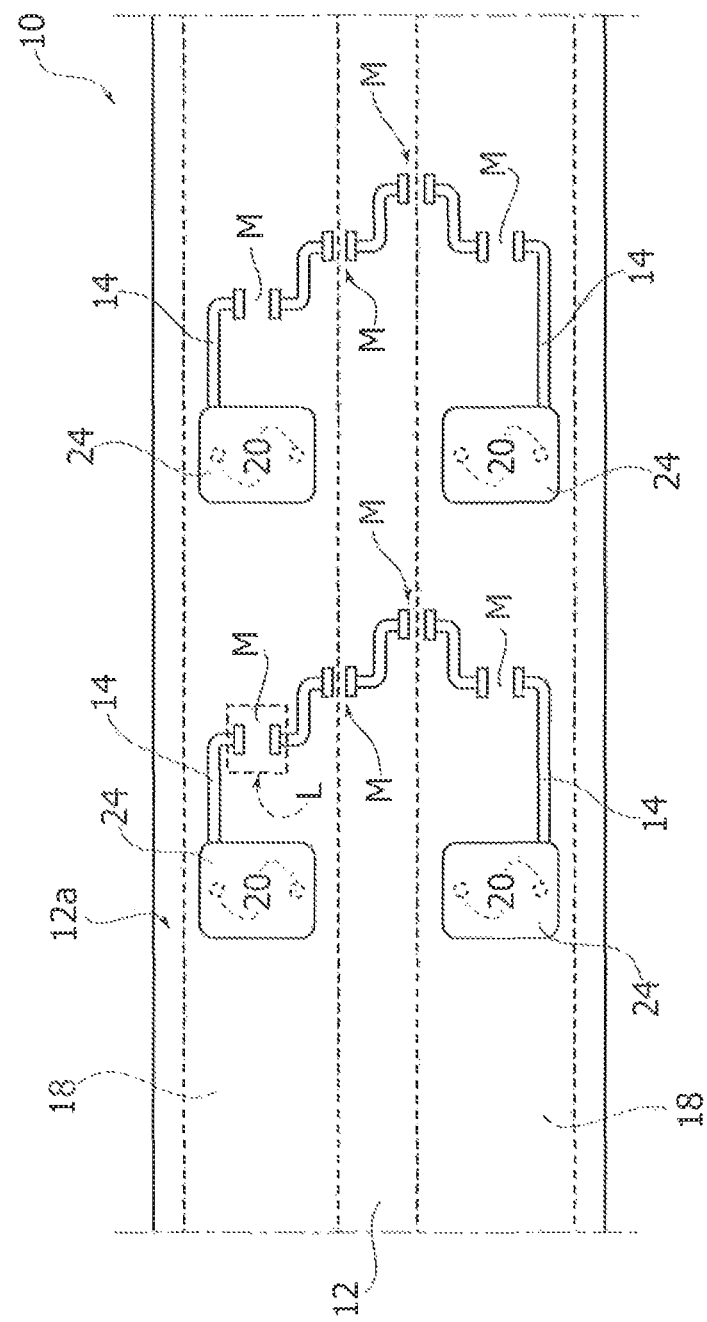

SUPPORT STRUCTURE FOR LIGHTING DEVICES, CORRESPONDING LIGHTING DEVICE AND METHOD

CROSS-REFERENCE TO RELATED APPLICATION

This application claims priority to Italian Patent Application Serial No. 102016000064860, which was filed Jun. 22, 2016, and is incorporated herein by reference in its entirety.

TECHNICAL FIELD

The description relates to support structures for lighting devices.

One or more embodiments may be applied to lighting devices employing electrically-powered light radiation sources, e.g. solid-state sources such as LED sources.

BACKGROUND

In recent times, especially in the electronic field, the printing of electrically conductive lines (traces) onto flexible substrates has become a relevant solution for the implementation of Printed Circuit Boards (PCBs) of the flexible type (Flexible Printed Circuits, FPCs). This solution is replacing, at least in some applications, the traditional technologies based on the use of copper and/or aluminium.

In comparison e.g. with the techniques of copper etching, one of the advantages which may be achieved through printing is the high versatility and flexibility in adapting to possible changes.

As a matter of fact, printing enables the introduction of new circuits and/or circuit layouts on an FPC support without relevant investments. Moreover, such changes may be implemented even directly by the electronic assembler, without the need of involving the FPC supplier, who otherwise would find himself in the position of adapting process steps (chemical processes such as etching, masking, photolithography etc.), with the consequent logistics and cost issues, in order to take the modifications into account.

These aspects may be particularly meaningful in the field of Solid State Lighting (SSL), wherein both products and sources (e.g. LED sources) are constantly and rapidly evolving.

The electrical conductivity of inks and other conductive materials (e.g. pastes) which may be used for printing e.g. onto an FPC, however, is still lower than the conductivity of traditional materials such as copper or aluminium, which are used in conventional circuits.

This may be a relevant limitation especially as regards flexible ("flex") linear LED modules, having a plurality of units connected in parallel, the maximal length of the flexible LED module being a function of the electrical resistance of the conductive lines or traces: the connection of a plurality of units implies a higher current intensity, with a corresponding increase of the voltage drop across the module.

The flexible linear LED modules which employ FPC circuits may be implemented as a series of Single Electrical Units (SEUs) connected in parallel along a ribbon-shaped support, i.e. a strip. The electrical connection among the various SEUs may be obtained e.g. through two conductive lines adapted to act as electrical distribution lines (e.g. acting as positive voltage, V+, and negative voltage, V−, supply lines) extending along the strip.

The number of such electrical distribution lines may be even higher if there is the need of exchanging driving signals (e.g. to perform a dimming function) or feedback signals (e.g. about the thermal behaviour of the sources) with the light radiation sources.

In this respect, a solution has been proposed wherein the electrical distribution lines (which may be present in a number of two or more) exhibit low ohmic resistance, e.g. thanks to the use of a material with low resistivity such as copper or aluminium, and/or through imparting a wide section area to such lines or traces, in such a way as to reduce resistance.

If a change of the circuit layout is needed, said solution imposes a nearly complete readjustment of the FPC structure, involving therefore the FPC supplier and leading to the previously mentioned logistics and cost issues.

Moreover, said copper/aluminium lines are normally available in standard thicknesses, e.g. amounting to 35-70-105 $\mu$m (1 $\mu$m=1×10$^{-6}$ m).

The use of a higher thickness leads to a decrease of line resolution, which imposes limits as regards small-sized components (e.g. LEDs). Another problem is that higher thicknesses affect the module flexibility/bendability, which are key features in a flexible module.

If, in order to increase the conductive cross-section, the width (instead of the thickness) of the lines is increased, this affects the size of the final product, which may be inconvenient for the end user.

Another solution proposed for elongate flexible LED modules consists in adding a second layer to the FPC component, so that the electrical distribution lines (+ and − and optionally driving signals) are arranged on the bottom layer and are connected to the top layer through electrically conductive vias.

In this way, the top layer hosts (only) the lines adapted to connect the vias with the circuits. Also in this case, if changes must be made, this solution imposes a re-designing and/or a rearrangement of the FPC component, requiring the intervention of the manufacturer thereof, at least as regards the top layer.

SUMMARY

One or more embodiments aim at overcoming the previously outlined drawbacks.

According to one or more embodiments, said object may be achieved thanks to a support structure having the features specifically set forth in the claims that follow.

One or more embodiments may also concern a corresponding lighting device, as well as a corresponding method.

The claims are an integral part of the technical teaching provided herein with reference to the embodiments.

One or more embodiments lead to the achievement of a high versatility/flexibility in the production of FPC components adapted to be used, for example, in flexible linear LED modules without requiring a shortening of the module.

One or more embodiments lead to the achievement of one or more of the following advantages:

fast and low-cost manageability of possible product and/or component changes in the case of flexible linear modules, printing with electrically conductive inks or pastes may be carried out while avoiding low conductivity, the possible changes in the FPC components may be implemented directly by the assembler of the electronic components, without requiring interventions by the FPC manufacturer, availability of different designs or different electrical circuits within one single type of FPC component, leading to a standardization of the pre-material (e.g. the FPC components to be purchased), the customization of the products by the customer is made easier and faster, and a higher flexibility of the module may be achieved due to the possible reduction of the overall thickness.

BRIEF DESCRIPTION OF THE FIGURES

One or more embodiments will now be described, by way of non-limiting example only, with reference to the annexed Figures, wherein:

FIG. 1 is a top view of a portion of a support structure according to one or more embodiments, FIG. 2 is a cross-section view along line II-II of FIG. 1, shown in an exploded representation for better clarity, and FIG. 3 is a view which approximately corresponds to the view of FIG. 1, and which exemplifies possible features of one or more embodiments.

It will be appreciated that, for clarity and simplicity of illustration, the various Figures may not be drawn to the same scale.

DETAILED DESCRIPTION

In the following description, various specific details are given to provide a thorough understanding of various exemplary embodiments according to the specification. The embodiments may be practiced without one or several specific details, or with other methods, components, materials, etc. In other instances, well-known structures, materials or operations are not shown or described in detail to avoid obscuring various aspects of the embodiments.

Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings provided herein are for convenience only, and therefore do not interpret the extent of protection or scope of the embodiments.

In the Figures, reference 10 generally denotes a support structure for lighting devices.

In one or more embodiments, said lighting devices may include e.g. electrically-powered light radiation sources, for example solid-state sources such as LED sources.

In order to simplify the graphical representation, the profile of only one of such devices, denoted as L, is shown in dashed lines in FIG. 1 and in FIG. 3.

It will generally be assumed that, in one or more embodiments, structure 10 may include a certain number of mounting locations M, destined to host said sources L (and/or components/circuits adapted to be associated to such sources L according to well-known criteria).

In one or more embodiments, structure 10 may be configured as a ribbon-shaped laminar structure of indefinite length (which may optionally be cut to length) whereof the Figures show a section. In one or more embodiments, structure 10 may include a core layer 12 of an electrically insulating material, adapted to include either organic materials (e.g. polymers such as polyimide, PI, or polyethylene naphthalate, PEN), or inorganic materials (e.g. glass, metal oxides, ceramics, etc.).

In one or more embodiments, such a core layer 12 may include coloured material and/or a light-permeable (transparent) material and/or a white-coloured material, e.g. having an overall reflectivity higher than 90%.

As a transparent material, one or more embodiments envisage the use e.g. of polyethylene terephthalate (PET) or a vitreous material.

In one or more embodiments, the electrically insulating layer 12 may have a first surface 12a ("front" or "top" surface) and a second surface 12b ("rear" or "bottom" surface).

In one or more embodiments, on the first surface 12a there may be provided locations, generally denoted as M, for mounting the light radiation sources L (e.g. LED sources) and/or further optional components and/or circuits associated thereto.

In one or more embodiments, on the first surface 12a of core layer 12 there may be provided a network of electrically conductive lines, denoted as 14, which extend between at least some of said mounting locations M and some locations on first surface 12a, which may host some lands 16: for reasons which will be better detailed in the following, such locations will also be named "fixed locations" herein.

In one or more embodiments, said fixed locations 16 may be distributed, e.g. with a regular spacing, along the length of structure 10. Of course, such a regular distribution is by no means a mandatory feature of the embodiments.

In one or more embodiments, on the second surface 12b of core layer 12 there may be provided electrical distribution lines 18.

In one or more embodiments, said electrically conductive lines 18 may be so-called "bus bars", extending along the length of structure 10, having e.g. the function of transferring along structure 10 the supply voltage (V+, V−) for light radiation sources L and/or the components/circuits associated thereto.

The annexed Figures show, by way of mere example only, the presence of two such lines 18. In one or more embodiments, lines 18 may be present in a different number, e.g. a higher number (three or more), e.g. when the structure 10 is supposed to bring about a distribution of driving signals for light radiation sources L and/or feedback signals (e.g. temperature measurement signals) provided by sources L.

As may be appreciated in the cross-section view of FIG. 2, in one or more embodiments the electrical connection between lines 14 and lines 18, respectively on the front surface 12a and on the rear surface 12b of core layer 12, may be obtained through electrically conductive vias 20 extending through electrically insulating core layer 12.

In one or more embodiments, the presently exemplified structure may also be rounded off by a further insulating substrate (cover layer) 22 applied for covering the electrical distribution lines 18 extending on the rear surface 12b of layer 12.

In one or more embodiments, structure 10 may be implemented as a flexible ribbon-shaped structure, which may be used e.g. for producing flexible (so-called "flex") linear LED modules.

In one or more embodiments, the electrical distribution lines 18 on the rear surface 12b may be implemented as low resistivity (low ohmic resistance) lines, adapted to comprise materials such as copper, aluminium, silver, gold, tin and metal alloys, through the use of processes such as etching, sputtering or selective removal.

In one or more embodiments, the network of electrically conductive lines 14 on the front surface 12a of core layer 12 may be obtained by printing electrically conductive materials (e.g. inks and/or pastes).

In one or more embodiments, the printing operation may be carried out starting from the fixed locations (lands) 16 and reaching, from such "fixed" locations, the mounting locations M, the position whereof may be selectively determined according to the specific application needs.

In this way, in one or more embodiments at least some of the electrically conductive lines 14 may be electrically connected (through vias 20) to the electrical distribution lines 18 formed on the rear surface 12b.

In one or more embodiments, lines 14 may be implemented through different printing techniques, such as laser printing, rotary printing, stencil printing, screen printing, or ink-jet printing.

It will be appreciated that e.g. ink-jet printing may be carried out without resorting to any specific tool, by simply acting, e.g. through software, on the driving of the printing jet.

Such printing techniques may also be used for the implementation of the vias 20, by employing electrically conductive inks or pastes.

In one or more embodiments, as exemplified in the Figures, the electrical connection between each fixed location (land) 16 and a corresponding electrical distribution line 18 may be implemented not through a single via 20 but through a plurality of vias 20, e.g. a pair of vias.

In one or more embodiments, the sequential and optionally regular distribution of the fixed locations 16 enables the implementation of modular arrangements, also as regards the possibility of cutting structure 10 to length according to the application needs.

In one or more embodiments, printed lines 14 may have a reduced length (extending e.g. from a fixed location 16 to a mounting location M), so that the reduced conductivity of the inks/pastes does not significantly affect the features of the final module.

The printing of lines 14 may be carried out directly by the assembler of the electronic circuit (support structure 10+ light radiation sources L and optional circuits associated thereto), the possibility being given of adapting easily, rapidly and cheaply to possible variations or changes both of the devices and of the circuit arrangement.

The arrangement of interconnecting vias at the fixed locations 16 enables to modify the overall circuit layout and, in addition, the mounting location M of the LEDs and of the circuits optionally associated thereto, without the need of an intervention by the manufacturer of the FPC component.

In one or more embodiments, the printed material (ink/paste) of lines 14 may have a thickness of approximately 5 $\mu$m ($5 \cdot 10^{-6}$ m.) or even lower. The thickness of the distribution lines 18 may be approximately 18 $\mu$m ($18 \cdot 10^{-6}$ m.).

In this way, the overall thickness of structure 10 (and of the lighting device wherein it is included) may be kept to low values, leading to advantages in flexibility and/or to a better heat dissipation, thanks to the low thickness of the interface.

In one or more embodiments, instead of printed material (ink or paste), the electrically conductive vias 20 may more traditionally include metals such as copper or aluminium, adapted to offer higher electrical conductivity than printing solutions.

In one or more embodiments, the thickness of the electrically conductive vias may optionally be increased to values such as 35 $\mu$m, 70 $\mu$m (1 $\mu$m=$10^{-6}$ m) for higher power applications.

In one or more embodiments, above fixed positions (lands) 16 there may provided metal layers 24: see the central part of FIG. 2, in dashed lines, and the top view of FIG. 3, wherein it is assumed (without limitation to the embodiments) that layers 24 wholly cover the fixed locations 16.

Such formations of electrically conductive material (e.g. metal) offer the possibility of implementing an effective and robust electrical connection for external connectors (including optional sliding connectors, which may damage a printed contact).

On formations 24 it is possible to solder e.g. external supply wires, which are connected by traditional soldering techniques. As an alternative, the lands for the connector or for soldering may be obtained by placing a planar metal (e.g. copper) support as a discrete component, which is deposited and is connected electrically on the areas 24 (which in turn may be obtained by printing).

It will be appreciated that, although in the present description the focus is laid on flexible support structures and therefore on flexible lighting modules, one or more embodiments lend themselves also to the implementation of rigid structures, similar to traditional Printed Circuit Boards (PCBs).

As mentioned in the foregoing, in one or more embodiments core layer 12 may include a coloured material, a diffusive material and/or a material having high reflectivity.

The use of a diffusive material (i.e. a material having a reduced mirroring component), e.g. a polymer adapted to scatter light, such as a transparent polymer embedding scattering particles (e.g. titanium dioxide) may lead to the improvement of the uniformity of light radiation emission.

If on the contrary the solution requires a high, mirror-like surface reflectivity, one or more embodiments may envisage the presence of e.g. a stack wherein:

the electrical distribution lines 18 on the rear surface 12b may comprise a material such as aluminium, i.e. with high reflectivity features, e.g. by arranging lines 18 at a small mutual distance (e.g. less than 1 mm.), the core layer 12 may include a light-permeable material (e.g. a transparent material such as polyethylene terephthalate, PET, or optionally a flexible or rigid vitreous material, in the case of a rigid application), and optionally, lines 14 may include light-permeable, e.g. transparent, material (ink or paste).

One or more embodiments may therefore provide a support structure (e.g. a laminar support structure) for lighting devices, the structure (which may optionally be ribbon-shaped and/or flexible) being adapted to include:

an electrically insulating core layer (e.g. 12) having a first (e.g. 12a) and a second (e.g. 12b) mutually opposed surfaces, with mounting locations (e.g. M) for electrically-powered light radiation sources (e.g. L) on the first surface, a network of electrically conductive lines (e.g. 14) printed on said first surface, said network including electrically conductive lines extending between at least some of said mounting locations and at least some fixed locations on said first surface, and electrical distribution lines (e.g. 18) of electrically conductive material on said second surface of the core layer, and electrically conductive vias (e.g. 20) extending through said core layer, said conductive vias electrically coupling said electrical distribution lines on said second surface with said network of electrically conductive lines at said fixed locations on said first surface.

In one or more embodiments, said network of electrically conductive lines may include electrically conductive ink or paste, printed on said first surface of the core layer.

In one or more embodiments, said electrically conductive vias may include printed ink or paste.

In one or more embodiments, said network of electrically conductive lines may be printed onto said first surface by laser printing, rotary printing, stencil printing, screen printing or ink jet printing.

In one or more embodiments, said electrical distribution lines may include electrically conductive lines produced by etching, sputtering or selective removal of electrically conductive material.

In one or more embodiments, said electrical distribution lines may include material selected out of copper, aluminium, silver, gold, tin and metal alloys.

One or more embodiments may include the provision of electrically conductive, advantageously printed, contact formations (e.g. 24) at said fixed locations of the first surface.

In one or more embodiments, said core layer may include a light-permeable material, and optionally:
said electrical distribution lines on said second surface may include a light reflective material, and/or
said electrically conductive lines printed on said first surface may include a light-permeable material.

One or more embodiments may include electrically conductive lands at said fixed locations on said first surface, at least one of said lands being optionally coupled to a plurality of said electrically conductive vias, in order to provide electrical coupling to one of said electrical distribution lines on said second surface (12*b*).

In one or more embodiments, a lighting device may include:
a support structure according to any of the embodiments, and
electrically-powered light radiation sources (e.g. L), optionally LED sources, mounted at said mounting locations on said first surface.

In one or more embodiments, a method of providing a support structure for lighting devices may include:
providing an electrically insulating core layer having a first and a second mutually opposed surfaces, with mounting locations for electrically-powered light radiation sources on the first surface,
printing, on said first surface, a network of electrically conductive lines, said network including electrically conductive lines extending between at least some of said mounting locations and said fixed locations on said first surface,
providing electrical distribution lines of an electrically conductive material on said second surface of the core layer, and
providing electrically conductive vias extending through said core layer, said conductive vias electrically coupling said electrical distribution lines on said second surface with said network of electrically conductive lines at said fixed locations on said first surface.

Without prejudice to the basic principles, the details and the embodiments may vary, even appreciably, with respect to what has been described herein by way of non-limiting example only, without departing from the extent of protection.

The extent of protection is defined by the annexed claims.

The invention claimed is:

1. A support structure for lighting devices, the structure including:
an electrically insulating core layer having first and second opposed surfaces, with mounting locations for electrically-powered light radiation sources on said first surface,
a network of an electrically conductive lines printed on said first surface, said network including electrically conductive lines extending between at least some of said mounting locations and fixed locations on said first surface,
electrical distribution lines of electrically conductive material on said second surface of the core layer, wherein one or more of the electrically conductive lines are thinner than the electrical distribution lines and wherein the one or more of the electrically conductive lines has a thickness of 5 μm or less;
electrically conductive vias extending through said core layer, said conductive vias electrically coupling said electrical distribution lines on said second surface with said network of electrically conductive lines at said fixed locations on said first surface.

2. The support structure of claim 1, wherein said network of electrically conductive lines includes electrically conductive ink or paste printed on said first surface of the core layer.

3. The support structure of claim 1, wherein said electrically conductive vias include printed electrically conductive ink or paste.

4. The support structure of claim 1, wherein said network of electrically conductive lines are printed by one of laser printing, rotary printing, stencil printing, screen printing or ink jet printing.

5. The support structure of claim 1, wherein said electrical distribution lines include electrically conductive lines produced by etching, sputtering or selective removal of electrically conductive material.

6. The support structure of claim 1, wherein said electrical distribution lines include material selected out of copper, aluminium, silver, gold, tin and metallic alloys.

7. The support structure of claim 1, further including electrically conductive contact formations at said fixed locations of the first surface.

8. The support structure of claim 1, wherein: said core layer includes light-permeable material.

9. The support structure of claim 1, further including electrically conductive lands at said fixed locations on said first surface, at least one of said lands coupled to a plurality of said electrically conductive vias to provide electrical coupling to one of said electrical distribution lines on said second surface.

10. A lighting device, including:
a support structure, wherein the support structure includes an electrically insulating core layer having first and second opposed surfaces, with mounting locations for electrically-powered light radiation sources on said first surface,
a network of an electrically conductive lines printed on said first surface, said network including electrically conductive lines extending between at least some of said mounting locations and fixed locations on said first surface, electrical distribution lines of electrically conductive material on said second surface of the core layer, wherein one or more of the electrically conductive lines are thinner than the electrical distribution lines and wherein the one or more of the electrically conductive lines has a thickness of 5 μm or less; and electrically conductive vias extending through said core layer, said conductive vias electrically coupling said electrical distribution lines on said second surface with said network of electrically conductive lines at said fixed locations on said first surface; and electrically-powered light radiation sources, mounted at said mounting locations on said first surface.

11. A method of providing a support structure for lighting devices, the method including:
providing an electrically insulating core layer having first and second opposed surfaces, with mounting locations for electrically-powered light radiation sources on said first surface,
printing on said first surface, a network of an electrically conductive lines, said network including electrically conductive lines extending between at least some of said mounting locations and fixed locations on said first surface,
providing electrical distribution lines of electrically conductive material on said second surface of the core layer, wherein one or more of the electrically conductive lines are thinner than the electrical distribution lines and wherein the one or more of the electrically conductive lines has a thickness of 5 μm or less: and providing electrically conductive vias extending through said core layer, said conductive vias electrically coupling said electrical distribution lines on said second surface with said network of electrically conductive lines at said fixed locations on said first surface.

12. The support structure of claim 1, further including electrically conductive, printed, contact formations at said fixed locations of the first surface.

13. The support structure of claim 8, wherein said electrical distribution lines on said second surface include light reflective material, and/or
said electrically conductive lines printed on said first surface include light-permeable material.

14. The lighting device of claim 10, wherein the electrically-powered light radiation sources are LED sources.

* * * * *